United States Patent
Asplin et al.

(10) Patent No.: US 11,469,282 B2
(45) Date of Patent: Oct. 11, 2022

(54) PHOTODETECTOR DEVICE INCLUDING A PHOTOACTIVE SEMICONDUCTOR OVER A CONDUCTOR PATTERN AND METHOD OF MAKING THE SAME

(71) Applicant: Flexenable Limited, Cambridge (GB)

(72) Inventors: Brian Asplin, Cambridge (GB); Shane Norval, Cambridge (GB); Jan Jongman, Cambridge (GB); Patrick Too, Cambridge (GB)

(73) Assignee: Flexenable Limited, Cambridge (GB)

( * ) Notice: Subject to any disclaimer, the term of this patent is extended or adjusted under 35 U.S.C. 154(b) by 217 days.

(21) Appl. No.: 16/753,663

(22) PCT Filed: Oct. 1, 2018

(86) PCT No.: PCT/EP2018/076647
§ 371 (c)(1),
(2) Date: Apr. 3, 2020

(87) PCT Pub. No.: WO2019/068641
PCT Pub. Date: Apr. 11, 2019

(65) Prior Publication Data
US 2020/0251544 A1    Aug. 6, 2020

(30) Foreign Application Priority Data

Oct. 3, 2017 (GB) ..................................... 1716126

(51) Int. Cl.
*H01L 27/32* (2006.01)
*H01L 27/30* (2006.01)

(52) U.S. Cl.
CPC ........ *H01L 27/3248* (2013.01); *H01L 27/307* (2013.01); *H01L 27/3274* (2013.01); *H01L 2227/323* (2013.01)

(58) Field of Classification Search
CPC combination set(s) only.
See application file for complete search history.

(56) References Cited

U.S. PATENT DOCUMENTS

| | | | |
|---|---|---|---|
| 5,229,316 A | 7/1993 | Lee et al. | |
| 6,521,913 B1 | 2/2003 | Murade | |
| (Continued) | | | |

FOREIGN PATENT DOCUMENTS

| | | |
|---|---|---|
| KR | 20000074522 A | 12/2000 |
| WO | 2016012466 A1 | 1/2016 |

OTHER PUBLICATIONS

International Search Report and Written Opinion in International Patent Application No. PCT/EP2018/076647, dated Dec. 11, 2018.
(Continued)

*Primary Examiner* — Nduka E Ojeh
(74) *Attorney, Agent, or Firm* — Dergosits & Noah LLP; Todd A. Noah

(57) ABSTRACT

A technique comprising: forming an insulator over a first conductor pattern; patterning the insulator to form an insulator pattern which exposes the first conductor pattern in one or more via regions; forming a second conductor pattern over the insulator pattern, which second conductor pattern contacts said first conductor pattern in said one or more via regions; creating a more even topographic profile in said one or more via regions, with the second conductor pattern exposed outside the one or more via regions; forming a semiconductor (24) over the second conductor pattern for charge carrier transfer between the second conductor pattern and the semiconductor; and depositing a third conductor (26) over the semiconductor, for charge carrier transfer between the third conductor (26) and the semiconductor (24).

12 Claims, 5 Drawing Sheets

(56) References Cited

U.S. PATENT DOCUMENTS

| | | | |
|---|---|---|---|
| 2005/0067945 A1* | 3/2005 | Nishikawa | H01L 51/5265 |
| | | | 313/506 |
| 2006/0219607 A1* | 10/2006 | Sato | G02F 1/136227 |
| | | | 257/E27.111 |
| 2013/0200401 A1 | 8/2013 | Takeuchi et al. | |
| 2014/0160066 A1* | 6/2014 | Kim | G06F 3/0445 |
| | | | 345/174 |
| 2015/0221893 A1* | 8/2015 | Teraguchi | H01L 27/3258 |
| | | | 438/35 |
| 2019/0013360 A1* | 1/2019 | Zhao | H01L 51/0003 |
| 2019/0237673 A1* | 8/2019 | Gao | H01L 51/006 |

OTHER PUBLICATIONS

Search Report in Great Britain Patent Application No. 1716126.6, dated Mar. 26, 2018.

* cited by examiner

PHOTODETECTOR DEVICE INCLUDING A PHOTOACTIVE SEMICONDUCTOR OVER A CONDUCTOR PATTERN AND METHOD OF MAKING THE SAME

CROSS REFERENCE TO RELATED APPLICATIONS

This application is a U.S. National Phase of International Patent Application No. PCT/EP2018/076647, filed Oct. 1, 2018, which claims priority to Great Britain Patent Application No. 1716126.6, filed Oct. 3, 2017, each of which is incorporated by reference in its entirety.

Photo-active devices comprise devices that include a photoactive semiconductor for e.g. optical sensor applications.

A photo-active device typically includes a photoactive semiconductor sandwiched between two electrodes for charge carrier transfer between the semiconductor and the two electrodes, wherein exposure of the photoactive semiconductor to light triggers the generation of charge carriers within the semiconductor, and the generation of a potential difference between the two electrodes.

An optical sensor device may comprise a photoactive semiconductor sandwiched between an array of pixel electrodes and a common electrode, wherein a set of electrical responses at the pixel electrodes provides an indication of the light pattern incident on the semiconductor. Circuitry for processing the electrical responses at the pixel electrodes may comprise circuitry below the array of pixel electrodes and connected to the pixel electrodes through vias in one more insulating layers.

The inventors for the present application have identified the challenge of facilitating a reduction in the separation between pixel and common electrodes in a photoactive device without increasing the risk of electrical shorts between the pixel and common electrodes and/or without increasing the risk of higher leakage current in reverse bias, which could reduce sensitivity of a photodetector device.

There is hereby provided a method, comprising: forming an insulator over a first conductor pattern; patterning the insulator to form an insulator pattern which exposes the first conductor pattern in one or more via regions; forming a second conductor pattern over the insulator pattern, which second conductor pattern contacts said first conductor pattern in said one or more via regions; creating a more even topographic profile in said one or more via regions, with the second conductor pattern exposed outside the one or more via regions; forming a semiconductor over the second conductor pattern for charge carrier transfer between the second conductor pattern and the semiconductor; and depositing a third conductor over the semiconductor, for charge carrier transfer between the third conductor and the semiconductor.

According to one embodiment, the method comprises: forming a first charge injection layer over the second conductor pattern, forming said semiconductor over the first charge injection layer, and forming a second charge injection layer over the semiconductor.

According to one embodiment, creating a more even topographic profile in the one or more via regions, comprises: covering the second conductor pattern with a plugging layer by a non-conformal deposition technique; irradiatively changing the solubility of the plugging layer in a first solvent in selected regions to create a solubility pattern in the plugging layer; and then developing the solubility pattern using said first solvent to create a physical pattern in the plugging layer.

According to one embodiment, patterning the insulator comprises exposing the insulator to a positive radiation image of the desired insulator pattern at a wavelength that decreases the solubility of the insulator; and wherein irradiatively changing the solubility of the plugging layer in the first solvent comprises exposing the plugging layer to a negative radiation image of said desired insulator pattern at a wavelength that decreases the solubility of the material.

According to one embodiment, patterning the insulator comprises exposing the insulator to a positive radiation image of the desired insulator pattern at a wavelength that decreases the solubility of the insulator; and wherein irradiatively changing the solubility of the plugging layer in the first solvent comprises exposing the plugging layer to a negative radiation image of a modification of said desired insulator pattern at a wavelength that decreases the solubility of the plugging layer, wherein said modification of said desired insulator pattern comprises via regions of increased diameter.

According to one embodiment, creating a more even topographic profile in the one or more via regions, comprises: covering the second conductor pattern with a plugging layer by a non-conformal deposition technique; and exposing the plugging layer to an etching treatment that etches the plugging layer at a faster rate than the second conductor pattern.

According to one embodiment, creating a more even topographic profile in the one or more via regions, comprises: covering the second conductor pattern with a plugging layer; forming a patterned etching mask over the plugging layer, and etching the plugging layer via the patterned etching mask.

According to one embodiment, said plugging layer comprises an insulating material.

According to one embodiment, said insulator also comprises said insulating material.

There is also hereby provided a device, comprising: an insulator pattern over a first conductor pattern; wherein the insulator pattern exposes the first conductor pattern in one or more via regions; a second conductor pattern over the insulator pattern, which second conductor pattern contacts said first conductor pattern in said one or more via regions; a plugging pattern over said second conductor pattern and creating a more even topographic surface profile in said one or more via regions, with the second conductor pattern exposed outside the one or more via regions; a semiconductor over the plugging pattern and over the second conductor pattern for charge carrier transfer between the second conductor pattern and the semiconductor; and a third conductor over the semiconductor, for charge carrier transfer between the third conductor and the semiconductor.

According to one embodiment, said plugging pattern comprises an insulating material.

According to one embodiment, said insulator also comprises said insulating material.

According to one embodiment, the device comprises one or more further conductor patterns between the first and second conductor patterns.

According to one embodiment, the device comprises one or more further conductor patterns between the first conductor pattern and the insulator pattern.

According to one embodiment, said first conductor pattern forms part of a stack of layers defining a transistor array.

Embodiments of the invention are described in detail, hereunder, by way of example only, with reference to the accompanying drawings, in which: —

FIG. 5 shows an SEM image of an example of an intermediate product at the stage shown in FIG. 4a.

Figure 1A:
FIGS. 1a to 1d illustrates process steps shared by three example processes according to embodiments of the invention.
Figure 1B:
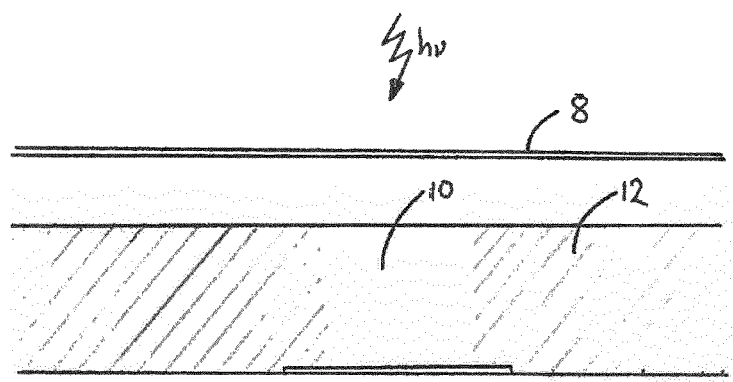
Figure 1C:
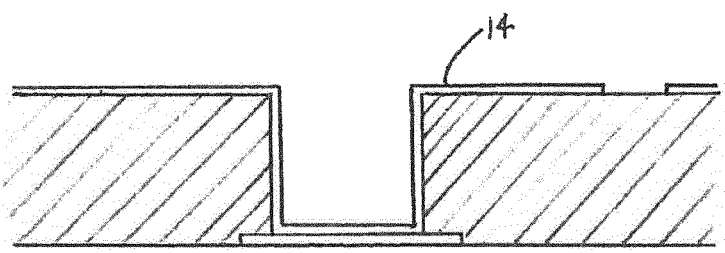

With reference to FIGS. 1a to 1d, three examples of processes according to embodiments of the present invention start with a substrate including at least a first conductor pattern which is to electrically contact a conductor pattern at a higher level. As discussed in more detail below, the substrate may include e.g. a flexible plastic support film supporting a stack of layers defining a TFT array and including the first conductor pattern 4. For conciseness, the accompanying drawings only show the first conductor pattern 4, and not any other layers/elements of the stack of which the first conductor pattern 4 may form part.

Electrical insulator material 6 is then deposited over the substrate (including the first conductor pattern 4) by a non-conformal deposition technique, to form an electrically insulating/isolation layer 6. The insulator material may for example, comprise a commercial material known as SU-8, which is composed of Bisphenol A Novolac epoxy dissolved in an organic solvent (such as propylene glycol methyl ether acetate (PGMEA)) and up to 10 wt % of mixed Triarylsulfonium/hexafluoroantimonate salt as a photoacid generator.

A positive radiation image of a pattern desired for the insulating layer 6 (i.e. a positive radiation image of the area pattern in which the insulating layer 6 is to remain, or in other words a negative radiation image of the area pattern in which insulating layer 6 is to be removed) is then projected onto the insulating layer 6 using a photomask 8, using radiation of a wavelength that induces a decrease in the solubility of the insulating layer 6 (e.g. ultraviolet radiation for the example of SU-8), and create a latent, solubility pattern in the insulating layer 6, comprising regions 12 of decreased solubility and regions 10 of unchanged solubility.

The latent, solubility pattern is then developed using a solvent, such as the same organic solvent used to deposit the insulator material, to form a physical pattern in the insulating layer 6, via which portions of the first conductor pattern 4 are exposed.

An alternative process for creating the desired pattern in the insulating layer 6 (defining the vias) comprises: forming a layer of photoresist material covering the insulating layer 6; creating in the photoresist layer a pattern corresponding to the pattern desired for the insulating layer 6; subjecting the upper surface of the resulting intermediate product to a dry etching process that etches the insulating layer 6 at a significantly faster rate than the resist pattern, so that the resist pattern acts as a protective mask during the dry etching treatment; and then stripping the resist pattern from the patterned insulating layer 6.

Another alternative process for creating the desired pattern in the insulating layer 6 uses a laser ablation technique.

Next, a second conductor pattern 14 is formed over the patterned insulating layer 6. The second conductor pattern 14 contacts the first conductor pattern 4 in the region of the vias defined by the insulating layer pattern 6. In this example, the second conductor pattern 14 defines an array of pixel electrodes, each in contact with a respective portion of the first conductor pattern 4. Formation of the second conductor pattern 14 may, for example, comprise: forming a layer of conductor material (e.g. metal), or a stack of layers of two or more conductor materials (e.g. two or more different metals/metal alloys) by e.g. a vapour deposition technique such as sputtering; and then patterning the conductor layer or stack of conductor layers by e.g. photolithography.

The second conductor pattern 14 is relatively thin (e.g. 70 to 140 nm) compared to the thickness of the insulating layer 6. The upper surface topographic profile after formation of the second conductor pattern 14 is substantially dictated by the topographic profile of the patterned insulating layer 6.

Figure 1D:
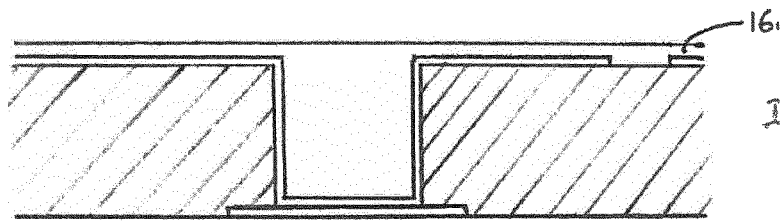

With reference to FIG. 1d, a plugging material (such as e.g. an organic insulating material, and more particularly e.g. the same insulator material as that used for insulating layer 6) is then deposited over the second conductor pattern 14 by a non-conformal deposition technique to form, after drying, a plugging layer 16 which covers the upper surface of the whole area of the second conductor pattern 14, but extends as little as possible above the upper surface of the second conductor pattern 14.

Figure 2A:
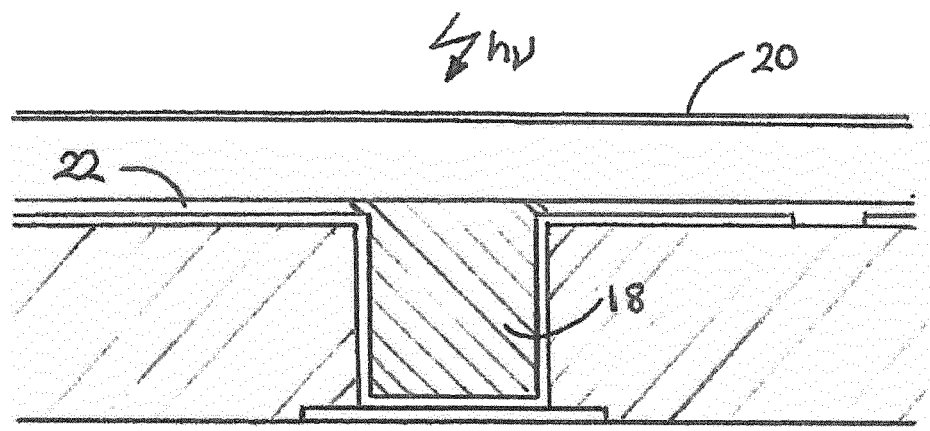
FIG. 2 illustrates more steps of a first example process according to an embodiment of the present invention.
Figure 2B:
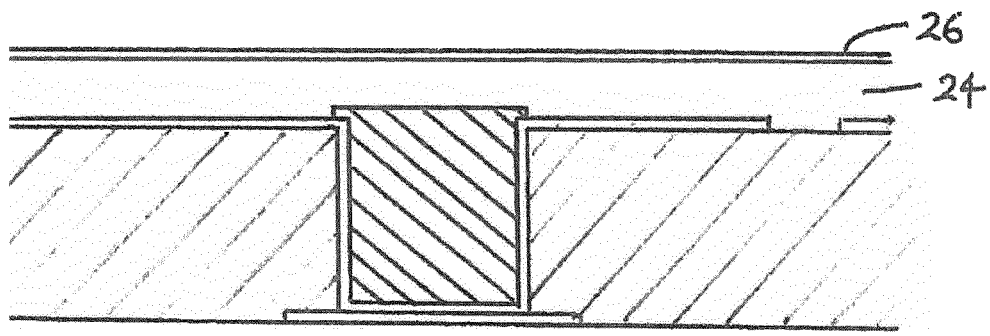

FIGS. 2a and 2b shows some next steps for a first example process according to an embodiment of the present invention. In this example, the plugging material 16 is the same material as that used for the insulating layer 6 (e.g. SU-8) or another material whose solubility can be decreased by a radiative technique. A negative radiation image of the insulator pattern (i.e. a negative radiation image of the area pattern in which insulating layer 6 remains, or in other words a positive image of the area pattern in which insulating layer 6 has been removed to define the vias) is projected onto the plugging layer 16 using a photomask 20 and using radiation of a wavelength that induces a decrease in the solubility of the plugging layer 16, to create a solubility pattern in the plugging layer 16, comprising regions of decreased solubility 18 and regions of unchanged solubility 22. This solubility pattern is then developed using a solvent, such as the solvent used to deposit the plugging material over the patterned second conductor 14, to form a physical pattern in the plugging layer 16. Plugging material is retained in the region of the vias defined by the insulator pattern 6, and the second conductor pattern is exposed outside the regions of the vias.

A layer of photoactive semiconductor 24 is formed over the upper surface of the resulting intermediate product for charge carrier transfer between the semiconductor and the second conductor pattern 14, and a common conductor 26 is formed over the upper surface of the photoactive semiconductor for charge carrier transfer between the common conductor 26 and the semiconductor 24. The common conductor 26 may or may not be patterned.

In all example processes, one or more layers of charge-injection material may be provided between the second conductor pattern 14 and the photoactive semiconductor 24, and/or between the photoactive semiconductor 24 and the common conductor 26. For example, an organic electron-injection layer (EIL) is deposited in contact with the second conductor pattern 14; the photoactive semiconductor 24 is deposited in contact with the organic electron-injection layer (EIL); and an organic hole-injection layer (HIL) is deposited in contact with the photoactive semiconductor 24.

Figure 3A:
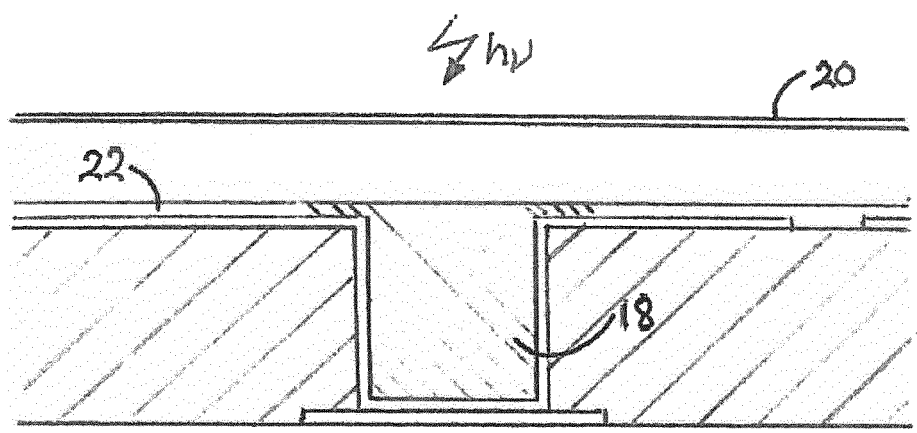
FIG. 3 illustrates more steps of a second example process according to an embodiment of the present invention.
Figure 3B:
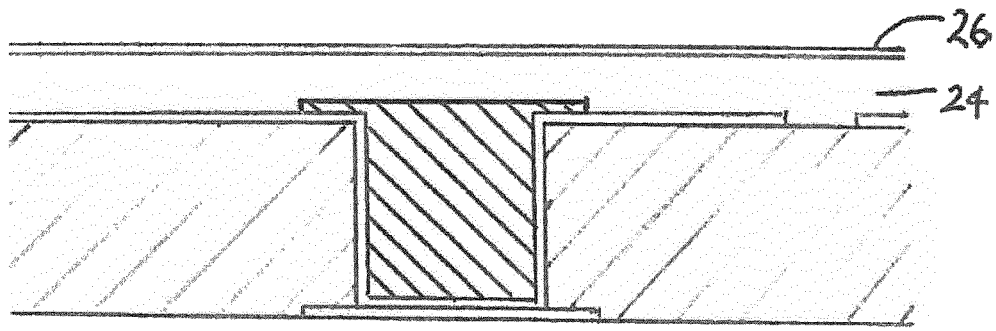

FIGS. 3a and 3b illustrate a second example process according to an embodiment of the present invention. The process shown in FIGS. 3a and 3b is the same as that shown in FIGS. 2a and 2b, except that: instead of projecting a negative radiation image of the exact pattern of the insulating layer 6 (i.e. a negative radiation image of the exact area pattern in which insulating layer 6 remains, or, in other words, a positive radiation image of the exact area pattern in which insulating layer 6 is absent to define the vias) onto the plugging layer 16; a negative radiation image of a modification of the pattern of the insulating layer (i.e. a negative radiation image of a modification of the area pattern in which insulating layer 6 remains, or a positive radiation image of a modification of the area pattern in which insulating layer 6 is absent to define the vias) is projected onto the plugging layer 16 using a photomask 20. The modification comprises an increased diameter for the via regions. FIG. 3a illustrates the result in the event of perfect alignment of the shadow mask 20 with the pattern of the insulating layer 6; the plugging layer 16 is exposed not only in the region of the vias, but also in an annular, surrounding region centred on the centre of the vias. This variation has the advantage that some misalignment of the shadow mask 20 relative to the pattern of the insulating layer 6 can be tolerated, while still achieving the retention of plugging material across the whole region of the vias.

Figure 4A:
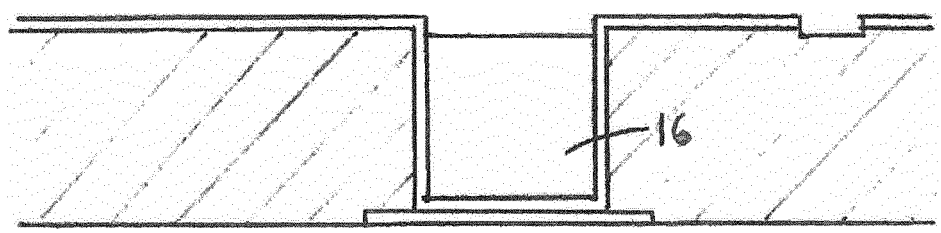
FIG. 4 illustrates more steps of a third example process according to an embodiment of the present invention.

FIG. 4 illustrates a third example process according to an embodiment of the present invention. In this third example, the upper surface of the plugging layer 16 (in both the via regions and outside the via regions) is subjected to a dry etching treatment that etches the material of the plugging layer 16 significantly faster than it etches the material of the second conductor pattern 14; the second conductor pattern 14 acts as an etch stop. The etching is carried out for a time calculated to etch the upper surface of the plugging layer 16 down to slightly below the second conductor pattern 14. This etching also removes a surface portion of the insulating layer 6 where it is exposed through the second conductor pattern 14.

The plugging layer 16 may, for example, be formed from the same material as the insulating layer 6. For example, the plugging layer may be formed by depositing SU-8, and then exposing the whole of the upper surface of the SU-8 layer (i.e. without using any photomask) to radiation at a wavelength that induces cross-linking in the SU-8 material, before starting the etching process.

Another etching technique for patterning the plugging layer 16 involves forming a photoresist pattern over the plugging layer, dry etching the plugging layer via the photoresist pattern, and then removing the remaining photoresist pattern.

Figure 4B:
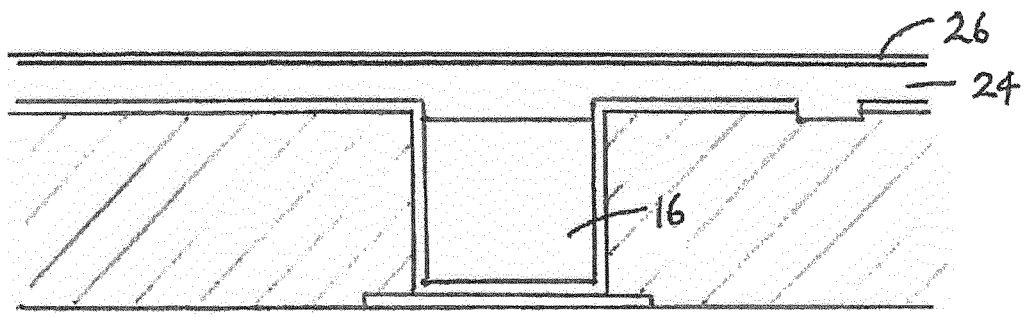
Figure 5:
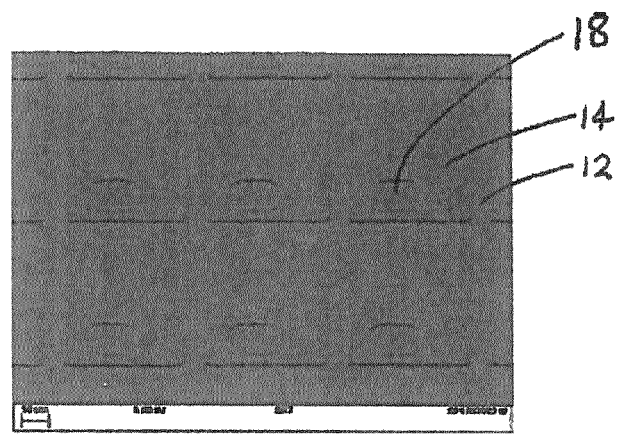
Figure 5:
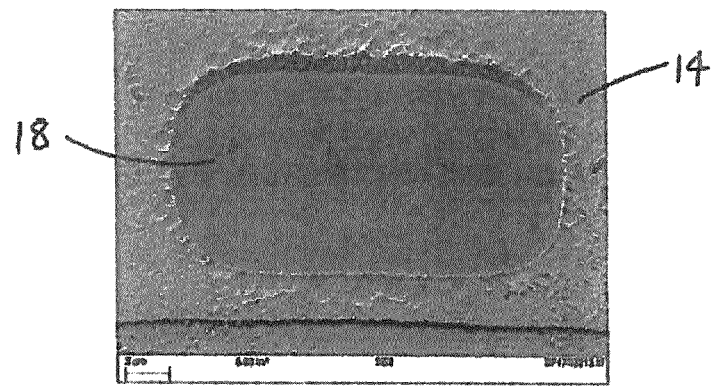

FIG. 5a shows a scanning electron microscopy (SEM) image of a device at the intermediate stage illustrated in FIG. 4b, and FIG. 5b shows an enlarged view of a portion of FIG. 5a. The SEM image shows: (i) the removal of the plugging layer 16 from over the second conductor pattern 14 in regions outside the via regions; (ii) retention of the second conductor pattern 14 in all regions, resulting from the resistance of the second conductor pattern to dry etching; and (iii) retention of the plugging layer 16 in the region of the vias, resulting from the increased starting thickness of the plugging layer 16 in these regions.

In each of the three examples described above, a more even topographic profile is created over which to deposit subsequent layers, such as the stack comprising charge-injection layers and the photoactive semiconductor layer 24.

The above-described techniques facilitate the formation of uniform layer(s) over the second conductor pattern (such as a stack comprising one or more charge-injection layers and the photoactive semiconductor), and each facilitate a reduction in the thickness of the layer(s) (such as a stack comprising one or more charge-injection layers and the photoactive semiconductor 24) between the pixel and common conductors 14, 26, without increasing a risk of electrical shorts between the pixel and common conductors 14, 26 and without increasing a risk of higher leakage currents in reverse bias. A reduction in the thickness of the photoactive semiconductor is advantageous, for example, for increasing the sensitivity of an optical sensor device.

In the above-described examples, the first conductor pattern 4 may, for example, define the source-drain level of a stack of layers (below the insulator pattern 6) defining an active matrix TFT array. A TFT array may, for example, comprise organic transistor devices (such as an organic thin film transistor (OTFT) devices). OTFTs comprise an organic semiconductor (such as e.g. an organic polymer or small-molecule semiconductor) for the semiconductor channels. The parts of the first conductor pattern 4 in electrical contact with the pixel electrodes of the second conductor pattern 14 may be drain conductors of respective TFTs at source-drain level. The source-drain level may also define an array of source conductors, each source conductor providing the source electrodes for a respective row of TFTs (pixels) and each extending to the edge of the TFT array for connection to a respective terminal of a driver chip; and the stack of layers defining the active matrix TFT array may also define a set of gate conductors, each providing the gate electrodes for a respective column of TFTs (pixels), and each extending to the edge of the TFT array for connection to a respective terminal of a driver chip. The unique combination of gate and source conductors for any pixel electrode enables detection/measurement of the photo-induced electrical response of the photoactive semiconductor in the region of that pixel electrode.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method of producing a photodetector device, comprising:
    forming an insulator over a first conductor pattern;
    patterning the insulator to form an insulator pattern which exposes the first conductor pattern in one or more via regions;
    forming a second conductor pattern over the insulator pattern, which second conductor pattern contacts the first conductor pattern in the one or more via regions;
    creating a more even topographic profile in the one or more via regions, with the second conductor pattern exposed outside the one or more via regions; depositing a photoactive semiconductor over the second conductor pattern for charge carrier transfer between the second conductor pattern and the photoactive semiconductor selectively outside the one or more via regions; and
    depositing a third conductor over the photoactive semiconductor, for charge carrier transfer between the third conductor and the photoactive semiconductor;

wherein the first conductor pattern forms part of electrical circuitry for detection/measurement of a photo-induced electrical response of the photoactive semiconductor;

wherein creating a more even topographic profile in the one or more via regions, comprises:

covering the second conductor pattern with a plugging layer by a non-conformal deposition technique;

irradiatively changing the solubility of the plugging layer in a first solvent in selected regions to create a solubility pattern in the plugging layer; and then developing the solubility pattern using the first solvent to create a physical pattern in the plugging layer; wherein patterning the insulator comprises exposing the insulator to a positive radiation image of the desired insulator pattern at a wavelength that decreases the solubility of the insulator; and wherein irradiatively changing the solubility of the plugging layer in the first solvent comprises exposing the plugging layer to a negative radiation image of a modification of the desired insulator pattern at a wavelength that decreases the solubility of the plugging layer, wherein the modification of the desired insulator pattern comprises via regions of increased diameter.

2. The method according to claim 1, comprising: depositing a first charge injection layer over the second conductor pattern, depositing the photoactive semiconductor over the first charge injection layer, and depositing a second charge injection layer over the photoactive semiconductor.

3. The method according to claim 1, wherein the plugging layer comprises an insulating material.

4. The method according to claim 3, wherein the insulator also comprises the insulating material.

5. A photoactive device, comprising:

an insulator pattern over a first conductor pattern; wherein the insulator pattern exposes the first conductor pattern in one or more via regions;

a second conductor pattern over the insulator pattern, which second conductor pattern contacts the first conductor pattern in the one or more via regions;

one or more further conductor patterns between the first and second conductor patterns;

a plugging pattern over the second conductor pattern and creating a more even topographic surface profile in the one or more via regions, with the second conductor pattern exposed outside the one or more via regions;

a photoactive semiconductor over the plugging pattern and over the second conductor pattern for charge carrier transfer between the second conductor pattern and the photoactive semiconductor selectively outside the one or more via regions; and a third conductor over the photoactive semiconductor, for charge carrier transfer between the third conductor and the photoactive semiconductor; wherein the first conductor pattern forms part of electrical circuitry for detection/measurement of a photo-induced electrical response of the photoactive semiconductor.

6. The photoactive device according to claim 5, wherein the plugging pattern comprises an insulating material.

7. The photoactive device according to claim 6, wherein the insulator also comprises the insulating material.

8. The device according to claim 5, wherein the first conductor pattern forms part of a stack of layers defining a transistor array.

9. A photoactive device, comprising:

an insulator pattern over a first conductor pattern; wherein the insulator pattern exposes the first conductor pattern in one or more via regions; one or more further conductor patterns between the first conductor pattern and the insulator pattern;

a second conductor pattern over the insulator pattern, which second conductor pattern contacts the first conductor pattern in the one or more via regions;

a plugging pattern over the second conductor pattern and creating a more even topographic surface profile in the one or more via regions, with the second conductor pattern exposed outside the one or more via regions;

a photoactive semiconductor over the plugging pattern and over the second conductor pattern for charge carrier transfer between the second conductor pattern and the photoactive semiconductor selectively outside the one or more via regions; and a third conductor over the photoactive semiconductor, for charge carrier transfer between the third conductor and the photoactive semiconductor; wherein the first conductor pattern forms part of electrical circuitry for detection/measurement of a photo-induced electrical response of the photoactive semiconductor.

10. The photoactive device according to claim 9, wherein the plugging pattern comprises an insulating material.

11. The photoactive device according to claim 10, wherein the insulator also comprises the insulating material.

12. The photoactive device according to claim 9, wherein the first conductor pattern forms part of a stack of layers defining a transistor array.

* * * * *